United States Patent
Hwang

(10) Patent No.: US 7,723,834 B2
(45) Date of Patent: May 25, 2010

(54) POP PACKAGE AND METHOD OF FABRICATING THE SAME

(75) Inventor: Sung-Wook Hwang, Gyeonggi-do (KR)

(73) Assignee: Samsung Electronics Co., Ltd., Yeongtong-gu, Suwoni-si, Gyeonggi-do (KR)

( * ) Notice: Subject to any disclaimer, the term of this patent is extended or adjusted under 35 U.S.C. 154(b) by 32 days.

(21) Appl. No.: 11/851,284

(22) Filed: Sep. 6, 2007

(65) Prior Publication Data

US 2008/0054437 A1    Mar. 6, 2008

(30) Foreign Application Priority Data

Sep. 6, 2006    (KR) .............. 10-2006-0085881

(51) Int. Cl.
 *H01L 23/495*    (2006.01)
(52) U.S. Cl. ............... 257/686; 257/693; 257/784; 257/E23.031
(58) Field of Classification Search ......... 257/686, 257/693, 784, E23.031
See application file for complete search history.

(56) References Cited

U.S. PATENT DOCUMENTS

| | | | | |
|---|---|---|---|---|
| 5,986,209 | A * | 11/1999 | Tandy | 174/530 |
| 6,313,998 | B1 * | 11/2001 | Kledzik et al. | 361/767 |
| 6,775,153 | B2 * | 8/2004 | Hashimoto | 361/803 |
| 6,900,529 | B2 * | 5/2005 | Kledzik et al. | 257/686 |
| 6,919,631 | B1 * | 7/2005 | Hoffman et al. | 257/707 |
| 7,190,062 | B1 * | 3/2007 | Sheridan et al. | 257/686 |
| 7,193,310 | B2 * | 3/2007 | Roeters et al. | 257/686 |

FOREIGN PATENT DOCUMENTS

| | | | |
|---|---|---|---|
| JP | 4-129258 | * 4/1992 | ............ 23/50 |
| JP | 2000-0299433 | 10/2000 | |
| JP | 2005-072190 | 3/2005 | |
| KR | 2000-0031572 | 6/2000 | |
| KR | 2006-0068971 | 6/2006 | |

OTHER PUBLICATIONS

English language abstract of Korean Publication No. 2000-0031572, Jun. 5, 2000.
English language abstract of Japanese Publication No. 2000-0299433, Oct. 24, 2000.
English language abstract of Japanese Publication No. 2005-072190, Mar. 17, 2005.

* cited by examiner

*Primary Examiner*—Victor A Mandala
(74) *Attorney, Agent, or Firm*—Muir Patent Consulting, PLLC

(57) ABSTRACT

A package-on-package (POP) package in which semiconductor packages are stacked using lead lines rather than conventional solder balls, and a fabricating method thereof are provided. According to the POP package and the fabricating method thereof of the present invention, the POP package is prevented from being short-circuited even when an underlying semiconductor package gets thicker and the POP package can sufficiently withstand deformation caused by post-fabrication warpage.

10 Claims, 14 Drawing Sheets

POP PACKAGE AND METHOD OF FABRICATING THE SAME

CROSS-REFERENCE TO RELATED APPLICATION

This application claims priority under 35 U.S.C. §119 to Korean Patent Application No. 10-2006-0085881, filed on Sep. 6, 2006, in the Korean Intellectual Property Office, the disclosure of which is incorporated herein in its entirety by reference.

BACKGROUND

1. Technical Field

The present invention relates to a package-on-package (POP) package and a fabricating method thereof, and more particularly, to a POP package which is prevented from being short-circuited even when an underlying semiconductor package is thick and which can sufficiently withstand deformation caused by post-fabrication warpage, and a fabricating method thereof.

2. Description of the Related Art

In recent years, as electronic products have been incorporating greater functionality, a number of devices need to be integrated in one substrate, which makes it difficult to achieve the desired compactness of the products. Accordingly, researchers are currently seeking a technique of integrating a number of devices in a limited space.

Mounting several chips in one semiconductor package is well known. Furthermore, a package-on-package (POP) package is well known in which a package is formed on another package.

A conventional POP package will be described with reference to FIG. 15.

A first semiconductor package 10 includes a first substrate 11 with a semiconductor chip (not shown) mounted thereon, a mold 14 for holding the semiconductor chip, and external contact electrodes 12 and solder balls 13 for connection to an external board.

A second semiconductor package 20 includes a second substrate 21 and a semiconductor chip (not shown) mounted thereon, a mold 24 for holding the semiconductor chip, and external contact electrodes 22 and solder balls 23 for connection to the underlying first semiconductor package 10.

The second semiconductor package 20 is stacked on the first semiconductor package 10 and connected thereto through the solder balls 23.

In the case where the first semiconductor package 10 is a multi-chip package (MCP) in which several semiconductor chips are stacked, in accordance with a recent trend, the mold 14 is thick and thus the solder balls connecting the first semiconductor package 10 to the second semiconductor package 20 should be large. Recently, as electronic products get more compact, packages get smaller, making it difficult to secure a sufficient interval between the solder balls. In other words, as the solder balls become larger to accommodate the height of the mold in the lower package, it is difficult to achieve sufficient spacing between the solder balls to prevent shorts between them.

As a result, there is a problem in that the solder balls are short-circuited, as shown in FIG. 16B. That is, the solder balls are desired to be evenly arranged as shown in FIG. 16A, but instead, they are lumped and short-circuited as shown in FIG. 16B.

In addition, a connection between stacked packages using solder balls causes the following problems: A fabricated POP package may be bent due to, for example, hardening or heating as time lapses and, in this case, a difference in warpage between the stacked semiconductor packages may cause disconnection between the packages, as shown in FIGS. 17A and 17B.

Accordingly, there is a need for a method for connection in a POP package which is capable of preventing short-circuits due to compactness of products and allowing a semiconductor package to sufficiently withstand deformation caused by post-fabrication warpage.

SUMMARY

The present invention provides a package-on-package (POP) package which is prevented from being short-circuited between connection terminals even when an underlying semiconductor package is thick and which can sufficiently withstand deformation caused by post-fabrication warpage.

The present invention also provides a method of fabricating a POP package which is prevented from being short-circuited between connection terminals even when an underlying semiconductor package is thick and which can sufficiently withstand deformation caused by post-fabrication warpage.

According to an aspect of the present invention, there is provided a package-on-package (POP) package including a first semiconductor package including a first substrate having external contact electrodes and a first semiconductor chip mounted on the first substrate; a second semiconductor package including a second substrate having external contact electrodes and a second semiconductor chip mounted on the second substrate, the second semiconductor package being located on the first semiconductor package; and lead lines for electrically connecting the external contact electrodes of the first substrate to the external contact electrodes of the second substrate.

BRIEF DESCRIPTION OF THE DRAWINGS

The above and other features and advantages of the present invention will become more apparent by describing in detail exemplary embodiments thereof with reference to the accompanying drawings in which.

DETAILED DESCRIPTION

Figure 1:
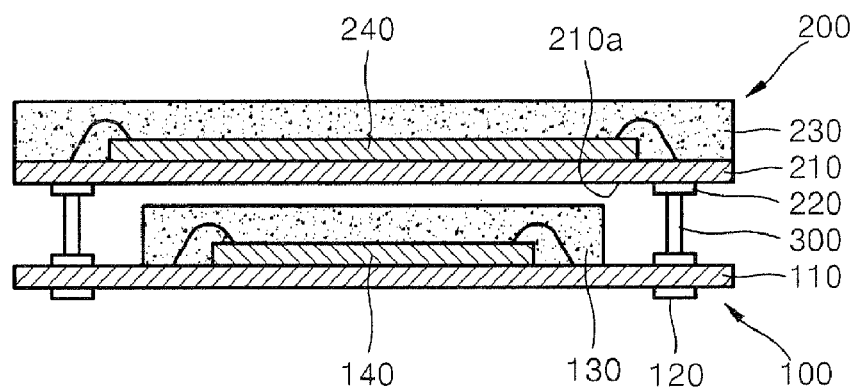
FIG. 1 illustrates a package-on-package (POP) package according to an embodiment of the present invention.

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. Like numbers refer to like elements throughout the specification. Furthermore, various elements and regions in the drawings are drawn in a schematic manner. Accordingly, the present invention is not limited by relative sizes and intervals shown in the accompanying drawings.

FIG. 1 illustrates a package-on-package (POP) package according to an embodiment of the present invention.

A POP package according to an embodiment of the present invention includes a first semiconductor package 100 including a first substrate 110 having external contact electrodes 120, and a first semiconductor chip 140 mounted on the first substrate 110. The first semiconductor chip 140 may be electrically connected with the first substrate 110 by wire bonding and held by a mold 130.

The POP package of the present invention further includes a second semiconductor package 200 including a second substrate 210 having external contact electrodes 220 and a second semiconductor chip 240 mounted on the second substrate 210. The second semiconductor chip 240 may be electrically connected with the second substrate 210 by wire bonding and held by a mold 230. Further, the external contact electrodes 220 may be slightly protruded from a lower surface 210a of the second substrate 210.

The first semiconductor package 100 and the second semiconductor package 200 may be fabricated by a typical semiconductor-package fabricating method. That is, the packages may be fabricated by bonding a semiconductor chip on a substrate, forming wire-bonding for the semiconductor chip, and molding the semiconductor chip using encapsulating resin. However, the present invention is not limited thereto.

The second semiconductor package 200 is located on the first semiconductor package 100, and the external contact electrodes 120 of the first substrate 110 are connected with the external contact electrodes 220 of the second substrate 210 through lead lines 300.

Figure 2A:
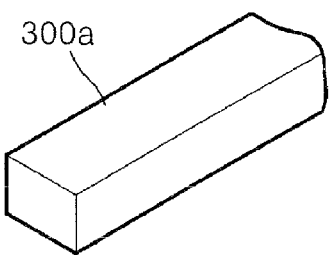
FIGS. 2A and 2B illustrate an end of a lead line of a POP package according to an embodiment of the present invention.
Figure 2B:
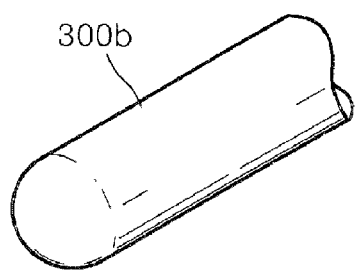

Referring to FIGS. 2A and 2B, the lead line 300 may be a bar having a polygonal cross-section such as a rectangular cross-section (as indicated by 300a) or a pin having a circular cross-section (as indicated by 300b). The lead line 300 has a length that may be properly selected depending on the height of the first semiconductor package, but the lead line 300 is not limited thereto.

The first semiconductor package 100 may be electrically connected with an underlying main board (not shown) via the external contact electrodes 120 of the first substrate 110. The external contact electrodes 120 and the main board may be connected to each other using, for example, solder balls but the present invention is not limited thereto.

Figure 3A:
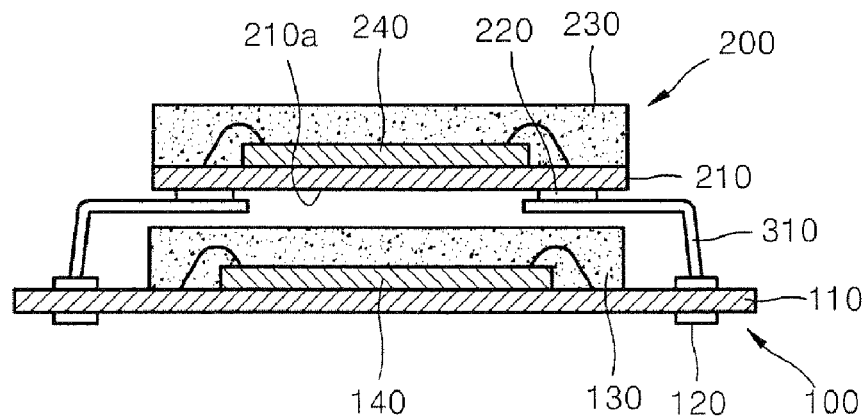
FIG. 3A illustrates a POP package according to another embodiment of the present invention.
Figure 3B:
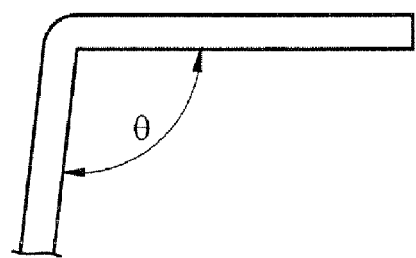
FIG. 3B illustrates a bent portion of the lead line of FIG. 3A.

The lead line 300 may have a form as shown in FIG. 3A. Referring to FIG. 3A, the lead line 310 may be connected such that a portion of the lead line 310 is substantially parallel with the lower surface 210a of the second substrate 210 in a position where the lead line 300 is connected with the external contact electrodes 220 of the second substrate 210. This is caused by a feature of the fabricating method that will be described below. Further, the lead line 310 may extend outside the second substrate 210 and then be bent toward the first semiconductor package 100. Referring to FIG. 3B, a bending angle θ may be about 90° or an obtuse angle. However, since too great of an angle θ requires an overly wide space for a connection between the first semiconductor package and the second semiconductor package, the bending angle θ may be about 90° to about 120°.

Figure 4A:
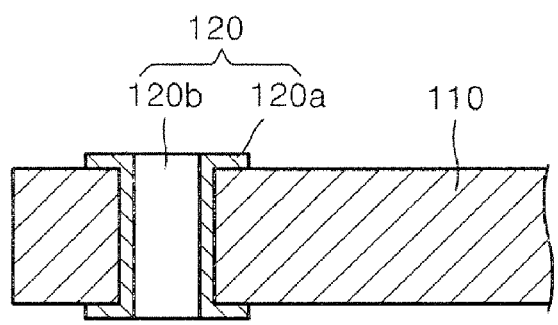
FIGS. 4A and 4B illustrate a connection between an external contact electrode of the first substrate and a lead line according to yet another embodiment of the present invention.
Figure 4B:
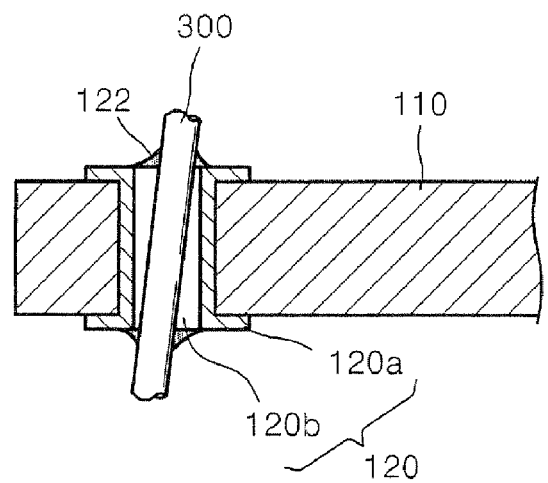

According to another embodiment of the present invention, each external contact electrode 120 of the first substrate 110 may be in a form of a hole 120b passing through the first substrate 110, as shown in FIG. 4A. That is, the hole 120b passing through the first substrate 110 may be first formed and then an external contact electrode 120a may be formed to coat an inner surface of the hole 120b. The external contact electrodes 120a coating the inner surface of the hole 120b may partially extend along the upper and lower surfaces of the first substrate 110. The external contact electrode 120 may be connected with an end of a circuit (not shown) formed on the first substrate 110. FIG. 4B illustrates a connection of the lead line 300 with the external contact electrode 120 of the first substrate 110. Referring to FIG. 4B, the lead line 300 is inserted into the external contact electrode 120 and electrically connected thereto through, for example, a solder 122.

Figure 5:
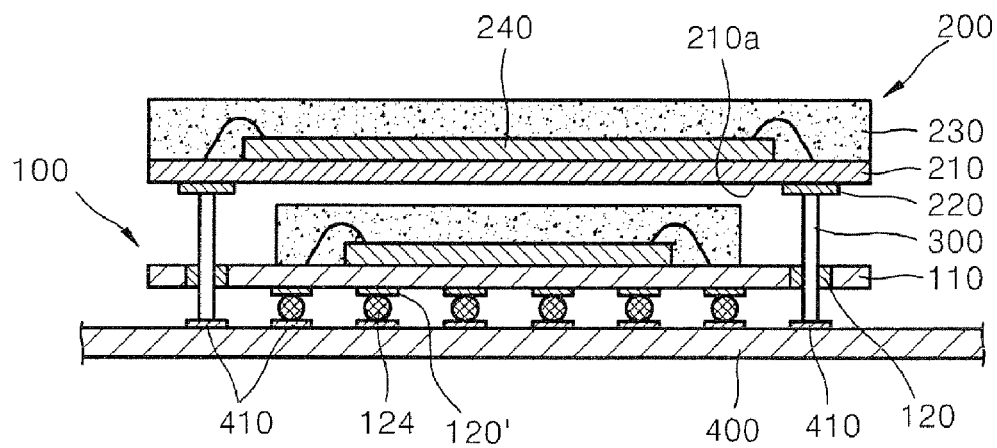
FIG. 5 illustrates a POP package of the present invention mounted on an external board.

The lead line 300 may sufficiently extend through the external contact electrode 120 of the first substrate 110 so as to be electrically connected with an external board, such as a main board. FIG. 5 illustrates the lead lines 300 that pass through the external contact electrodes 120 of the first substrate 110 and are directly connected to contact electrodes 410 of the external board 400. The contact electrodes 410 may be connected to an end of a circuit (not shown) formed on the external board 400.

The external contact electrodes 120' of the first substrate 110 may be connected with the contact electrodes 410 of the external board 400 through, for example, solder balls 124.

Figure 6A:
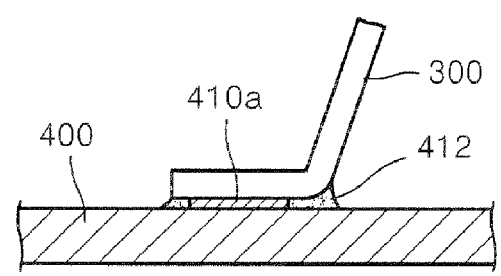
FIGS. 6A and 6B illustrate ends of lead lines when a POP package is mounted on an external board.
Figure 6B:
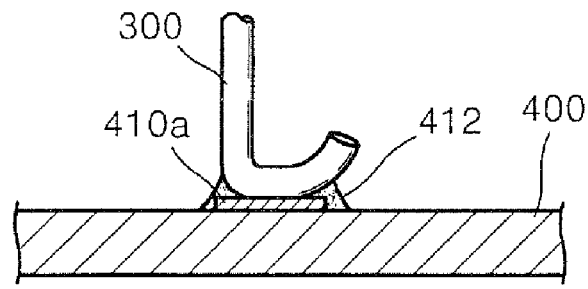

The lead lines 300 may be connected with the contact electrodes 410 of the external board 400 in a standing form as shown in FIG. 5 or in a gull-wing or J form as shown in FIGS. 6A and 6B.

Figure 7A:
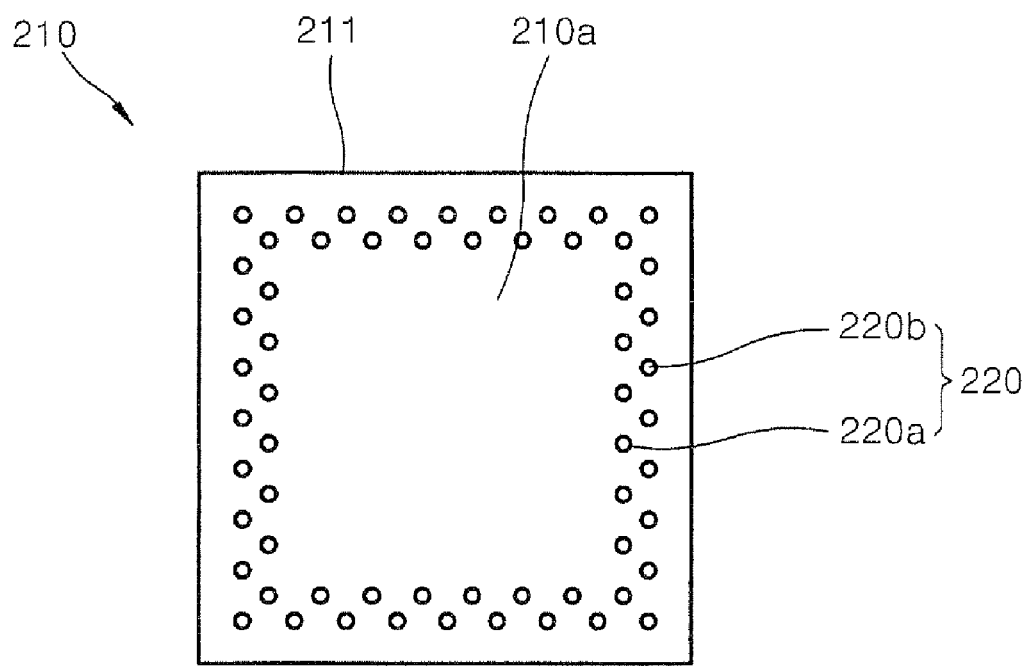
FIGS. 7A and 7B illustrate a lower surface of the second substrate and lead lines connected thereto according to some embodiments of the present invention, respectively.

According to another embodiment of the present invention, the external contact electrodes 220 of the second substrate 210 are formed in two lines along an outer perimeter of the lower surface 210a of the second substrate 210, in which the outer external contact electrodes and the inner external contact electrodes may be formed in a zigzag pattern. FIG. 7A illustrates the lower surface of the second substrate 210.

Figure 7B:
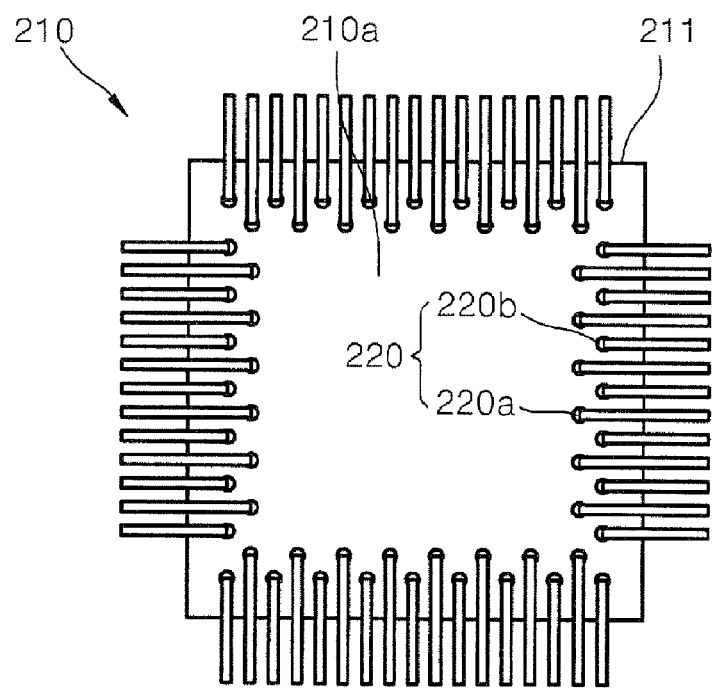

Referring to FIG. 7A, the external contact electrodes 220 are formed as the outer external contact electrodes 220b and the inner external contact electrodes 220a in two lines along the outer perimeter 211 of the second substrate 210 on the lower surface 210a thereof. Particularly, the outer external contact electrodes 220b and the inner external contact electrodes 220a are formed in a zigzag pattern. This zigzag pattern allows lead lines connected to the inner external contact electrodes 220a to be easily connected with the first semiconductor package 100 without being brought into contact with lead lines connected to the outer external contact electrodes 220b, as shown in FIG. 7B.

According to another embodiment of the present invention, the external contact electrodes 220 of the second substrate 210 are formed in two lines 220a and 220b along the outer perimeter on the lower surface 210a of the second substrate 210, the lead lines 300 connected with the outer external contact electrodes 220b in parallel with the lower surface 210a of the second substrate 210 extend outside of the second substrate 210, are bent toward the first semiconductor package 100, and are connected to the external contact electrodes 120 of the first substrate 110, and the lead lines 300 connected with the inner external contact electrodes 220a in parallel with the lower surface 210a of the second substrate 210 are bent toward the first semiconductor package and then connected to the external contact electrodes 120 of the first substrate 110. In other words, the lead lines 300 are first connected to the external contact electrodes 220 in parallel with the lower surface 210a of the second substrate and then the lead lines 300 are bent so as to form an angle with the lower surface 210a.

Figure 8:
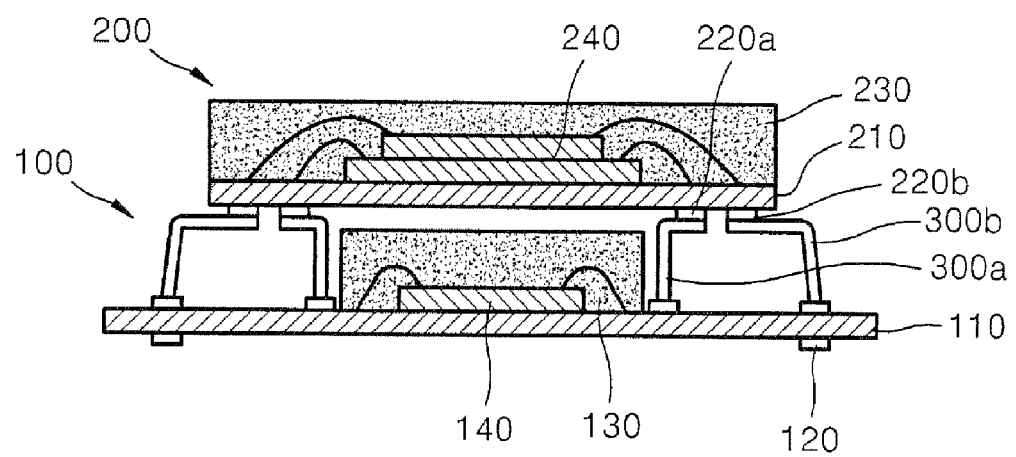
FIG. 8 illustrates a POP package according to some embodiments of the present invention.

FIG. 8 is a side view schematically illustrating the above embodiment. Referring to FIG. 8, the external contact electrodes 220 are formed in two lines 220a and 220b on the lower surface 210a of the second semiconductor package 200. The external contact electrodes 220a and 220b in the two lines are similar with those shown in FIG. 7A except that the inner external contact electrodes 220a and the outer external contact electrodes 220b do not have to be located in a zigzag pattern.

The first lead lines 300a correspondingly connected with the inner external contact electrodes 220a and the second lead lines 300b correspondingly connected with the outer external contact electrodes 220b extend in parallel with the lower surface 210a of the second substrate 210. Then, the first lead lines 300a and the second lead lines 300b are bent toward the first semiconductor package 100 and connected with the external contact electrodes 120 of the first substrate 110.

All or at least some of the lead lines 300a and 300b may pass through the first substrate 110, extend to an external board on which the POP package including the first semiconductor package 100 and the second semiconductor package 200 is mounted, and can be connected with contact electrodes on the external board.

In the above embodiments, at least one of the first semiconductor package and the second semiconductor package mounted in the POP package may be a multi-chip package (MCP).

A method of fabricating a POP package according to an embodiment of the present invention will now be described with reference to the accompanying drawings.

First, the first semiconductor package 100 and the second semiconductor package 200 are prepared. The first semiconductor package 100 includes the first substrate 110 and the first semiconductor chip 140 mounted on the first substrate 110. The first substrate 110 may include the external contact electrodes 120. The first semiconductor chip 140 may be mounted on the first substrate 110 through, for example, wire-bonding, but the present invention is not limited thereto. The second semiconductor package 200 may be prepared using the same method as the first semiconductor package 100. The first semiconductor package 100 and the second semiconductor package 200 may be formed as shown in FIGS. 1, 3A, 5 and/or 8.

Figure 9:
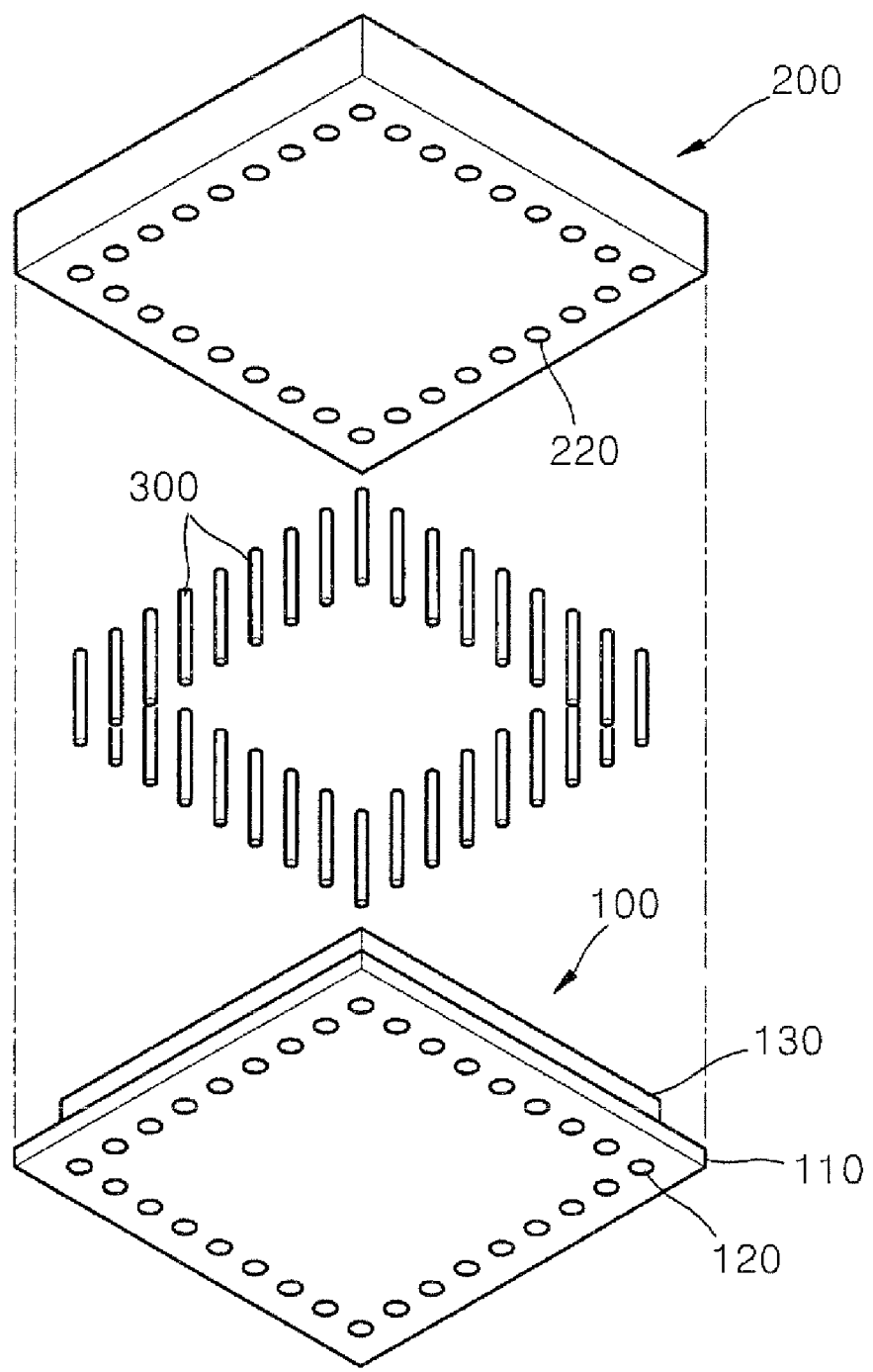
FIG. 9 is an exploded perspective view illustrating a process in which a first semiconductor package and a second semiconductor package are connected through lead lines according to an embodiment of the present invention.

Then, as shown in FIG. 9, the external contact electrodes 220 of the second substrate 210 are aligned and electrically connected with the corresponding lead lines 300, the second semiconductor package 200 is placed on the first semiconductor package 100, and the lead lines are electrically connected with the external contact electrodes 120 of the first substrate 110, such that the external contact electrodes 120 of the first substrate 110 and the external contact electrodes 220 of the second substrate 210 are electrically connected to each other.

The process of aligning and electrically connecting the external contact electrodes 220 of the second substrate 210 with the lead lines 300 will be described in detail with reference to FIGS. 10A through 10E.

Figure 10A:
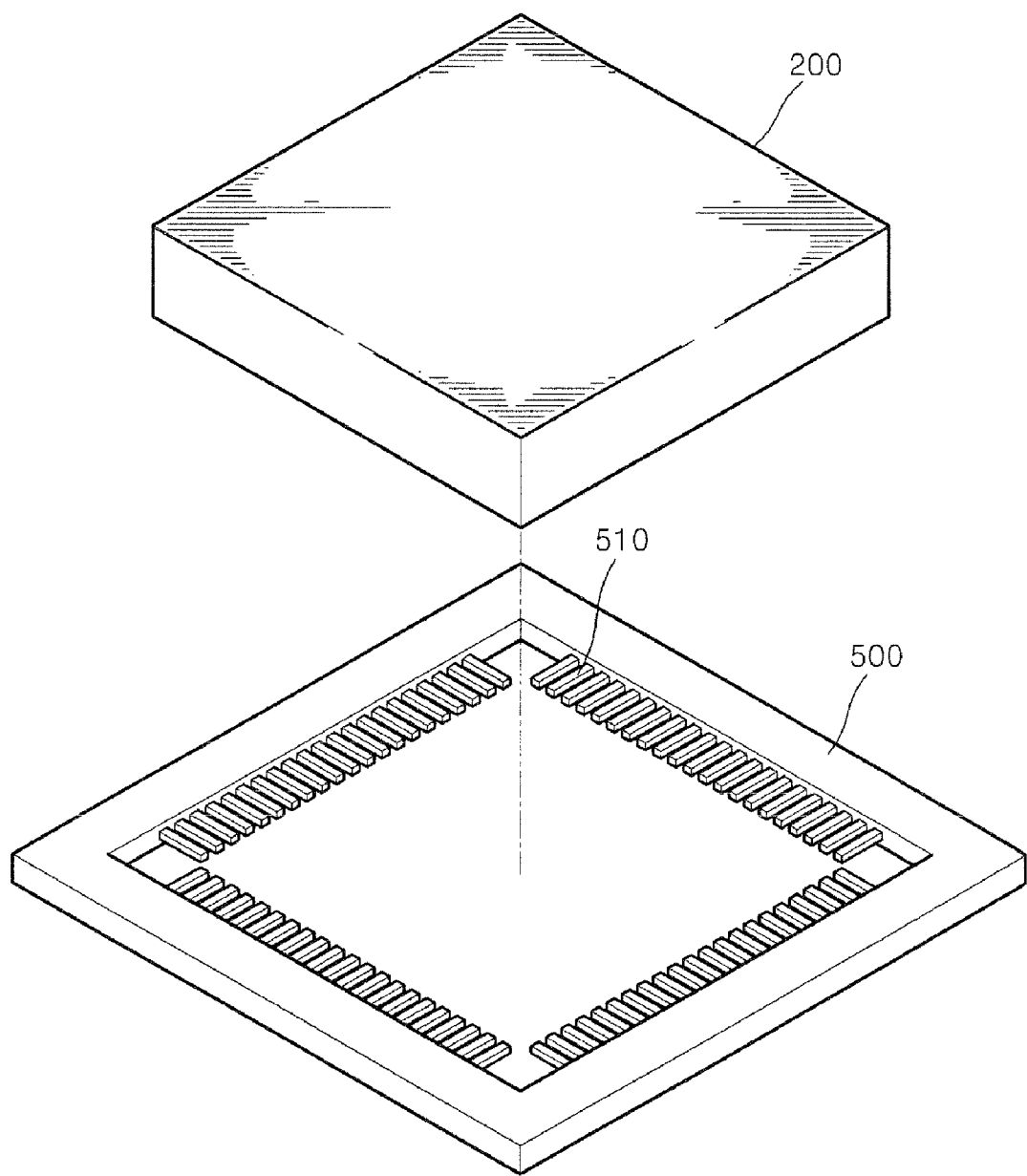
FIGS. 10A through 10E sequentially illustrate a method for forming lead lines in a second semiconductor package according to an embodiment of the present invention.
Figure 10B:
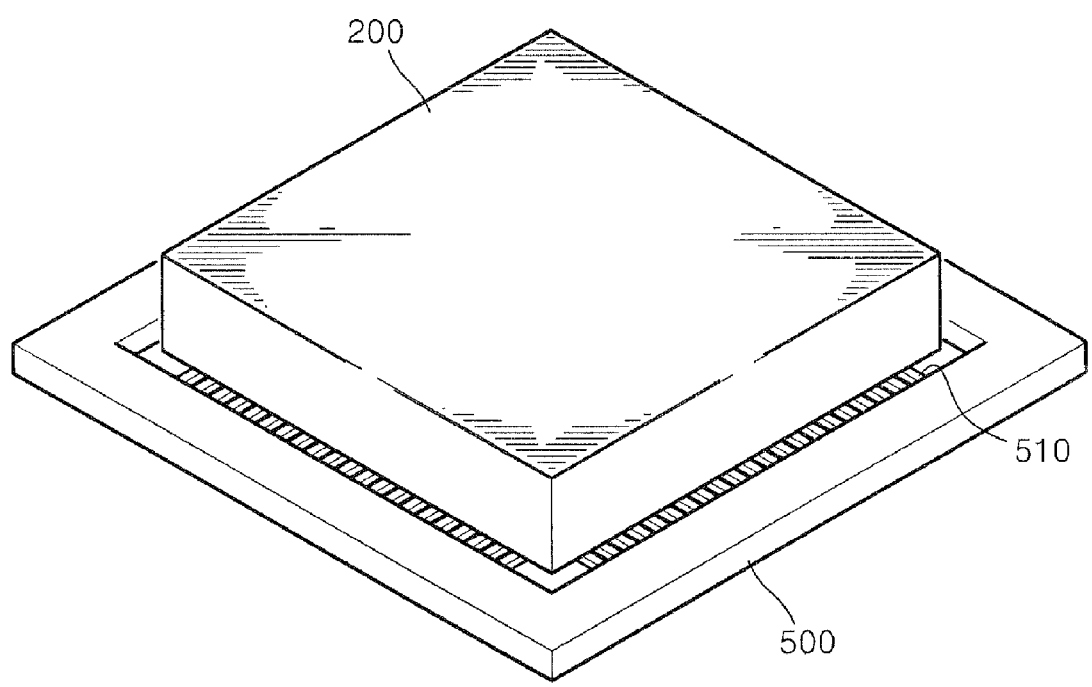
Figure 10C:
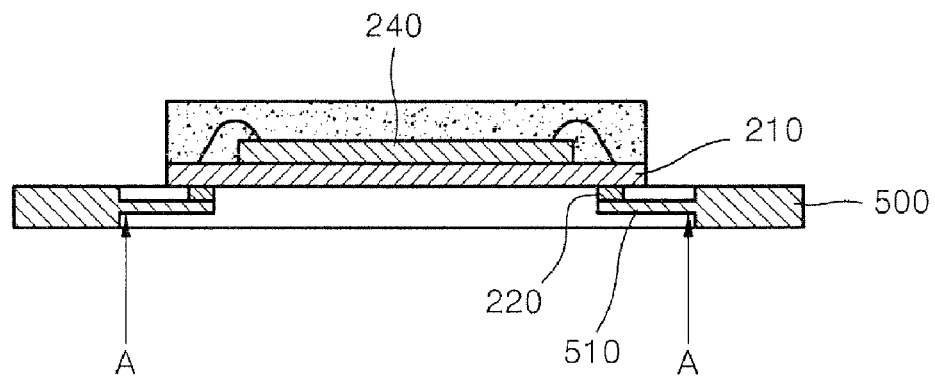

Referring to FIGS. 10A and 10B, a lead frame 500 having lead lines 510 formed thereon to correspond to the external contact electrodes of the second semiconductor package 200 is prepared and located under the second semiconductor package 200. FIG. 10C illustrates a cross-section of FIG. 10B. As shown in FIG. 10C, the external contact electrodes 220 of the second substrate 210 are bonded to an end of the lead lines 510. For bonding, as an example, a conductive resin, a conductive tape or a solder may be used but the present invention is not limited thereto.

Figure 10D:
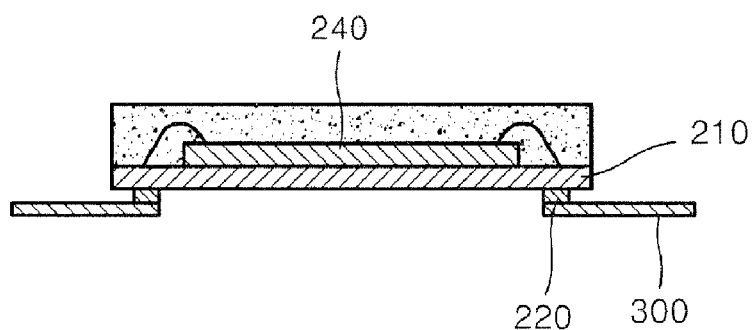
Figure 10E:
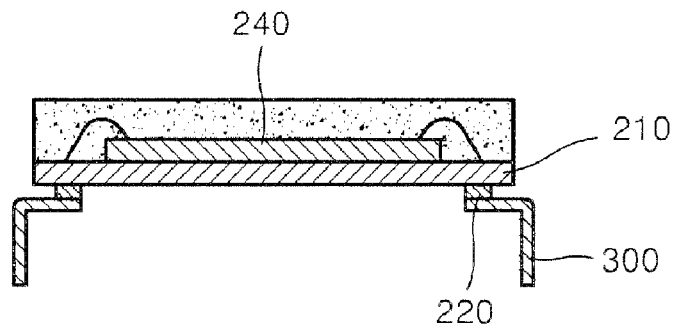

A point corresponding to location A of FIG. 10C is then cut out to separate the second semiconductor package 200 having the lead lines 300 bonded thereto from the lead frame 500 (FIG. 10D). As shown in FIG. 10E, the lead lines 300 are then bent so that they can be connected with the underlying first semiconductor package 100.

Although the method for forming the lead lines by mounting one semiconductor package on one lead frame is shown in FIGS. 10A through 10F, lead lines may be formed in several semiconductor packages at one time by coupling several lead frames as shown in FIG. 10A repeatedly and horizontally and mounting the semiconductor packages on each lead frame substantially simultaneously.

The step of preparing the second semiconductor package may include forming external contact electrodes of the second substrate in two lines along the outer perimeter of the second substrate on the lower surface thereof. The external contact electrodes formed in two lines along the outer perimeter of the second substrate on the lower surface thereof are shown FIG. 7A, but they do not have to be necessarily formed in a zigzag pattern. Among the external contact electrodes in the two lines, the outer external contact electrodes are defined as first external contact electrodes 220b and the inner external contact electrodes are defined as second external contact electrodes 220a.

Figure 11:
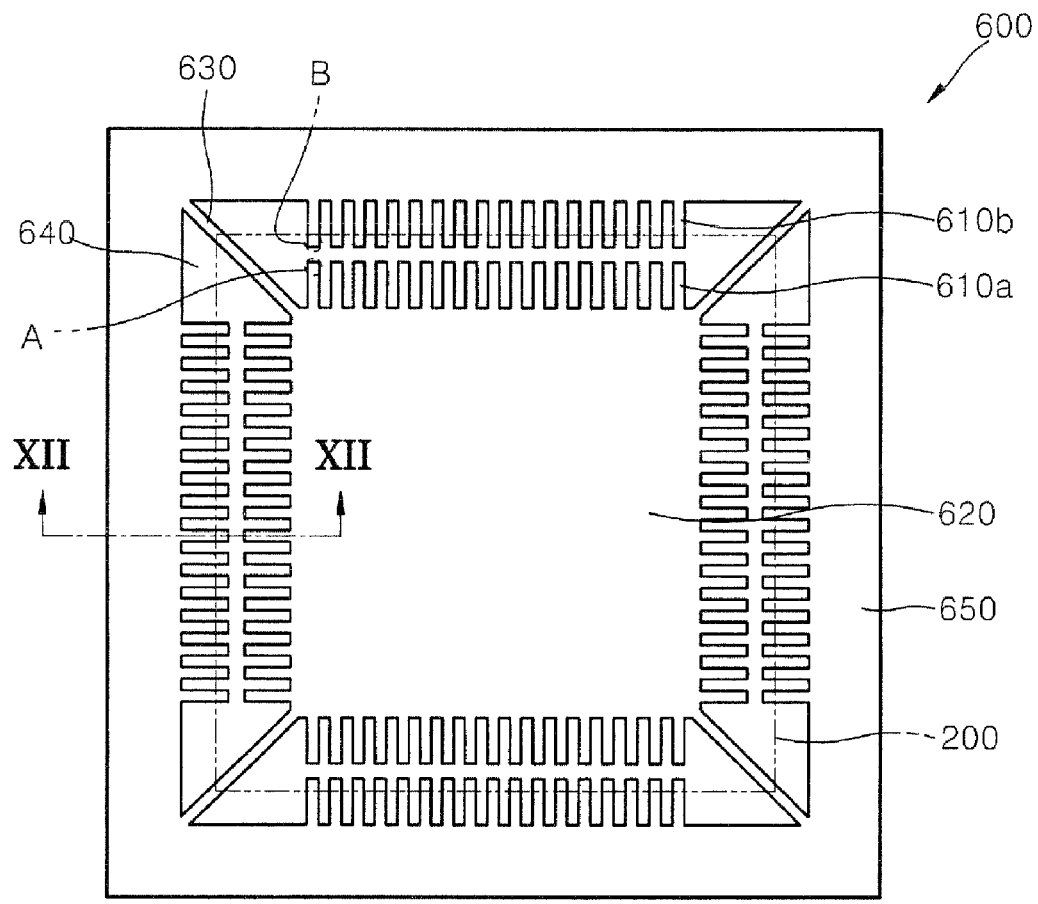
FIG. 11 illustrates a lead frame for forming lead lines in a second semiconductor package according to an embodiment of the present invention.

Connecting the lead lines 300 with corresponding ones of the external contact electrodes 220 formed in two lines will be described. First, a lead frame 600 as shown in FIG. 11 is prepared. The lead frame 600 includes a lead frame support 650 and a punched portion 640 formed therein, a pad 620 located at a center of the punched portion 640, a bridge 630 for connecting the pad 620 to the lead frame support 650 and supporting it, first lead lines 610b formed along an inner perimeter of the punched portion 640 and corresponding to the first external contact electrodes, and second lead lines 610*a* formed along an outer perimeter of the pad 620 and corresponding to the second external contact electrodes.

The second semiconductor package 200 is placed on the lead frame 600 as indicated by a dotted line in FIG. 11. The first external contact electrodes of the second semiconductor package are bonded to the first lead lines 610*b*, particularly, portion B of FIG. 1, and the second external contact electrodes are bonded to the second lead lines 610*a*, particularly, portion A of FIG. 11.

Figure 12:
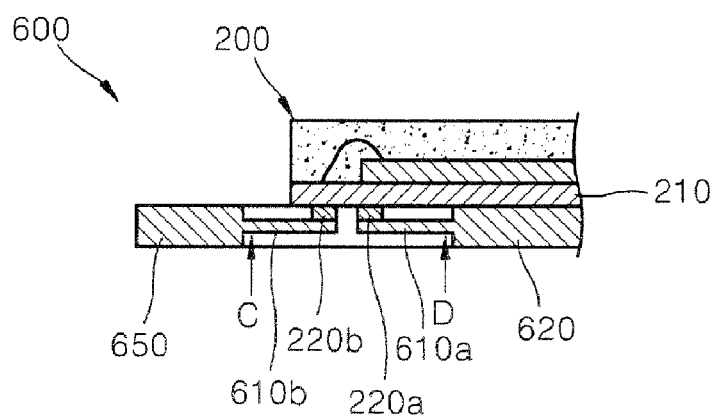
FIGS. 12 and 13 illustrate a process of forming lead lines in external contact electrodes of the second semiconductor package using the lead frame of FIG. 11.

FIG. 12 is a cross-sectional view taken along line XII-XII of FIG. 11. Referring to FIG. 12, the first lead lines 610*b* of the lead frame 600 are correspondingly connected to the first external contact electrodes 220*b* of the second semiconductor package 200, and the second lead lines 610*a* of the lead frame 600 are correspondingly connected to the second external contact electrodes 220*a*.

Figure 13:
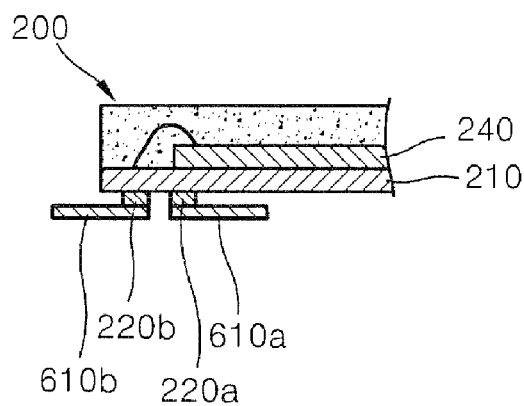

An end portion of the first lead lines 610*b* directed outside the second semiconductor package 200 ("C" of FIG. 12) and an end portion of the second lead line 610*a* directed inside the second semiconductor package 200 ("D" of FIG. 12) are then cut out. A cutting result is shown in FIG. 13, in which the lead lines 610*a* and 610*b* are formed on the external contact electrodes 220*a* and 220*b*, respectively.

The lead lines 610*a* and 610*b* may be then bent toward the first semiconductor package (downward in FIG. 13) and connected with the first semiconductor package. The lead lines 610*a* and 610*b* may be bent using a typical method, but the present invention is not limited thereto.

The second semiconductor package 200 may be prepared by forming the external contact electrodes 220 of the second substrate 210 in two lines along the outer perimeter of the second substrate 210 on the lower surface thereof, with the outer external contact electrodes 220 and inner external contact electrodes 220 in the two lines arranged in a zigzag pattern.

Figure 14:
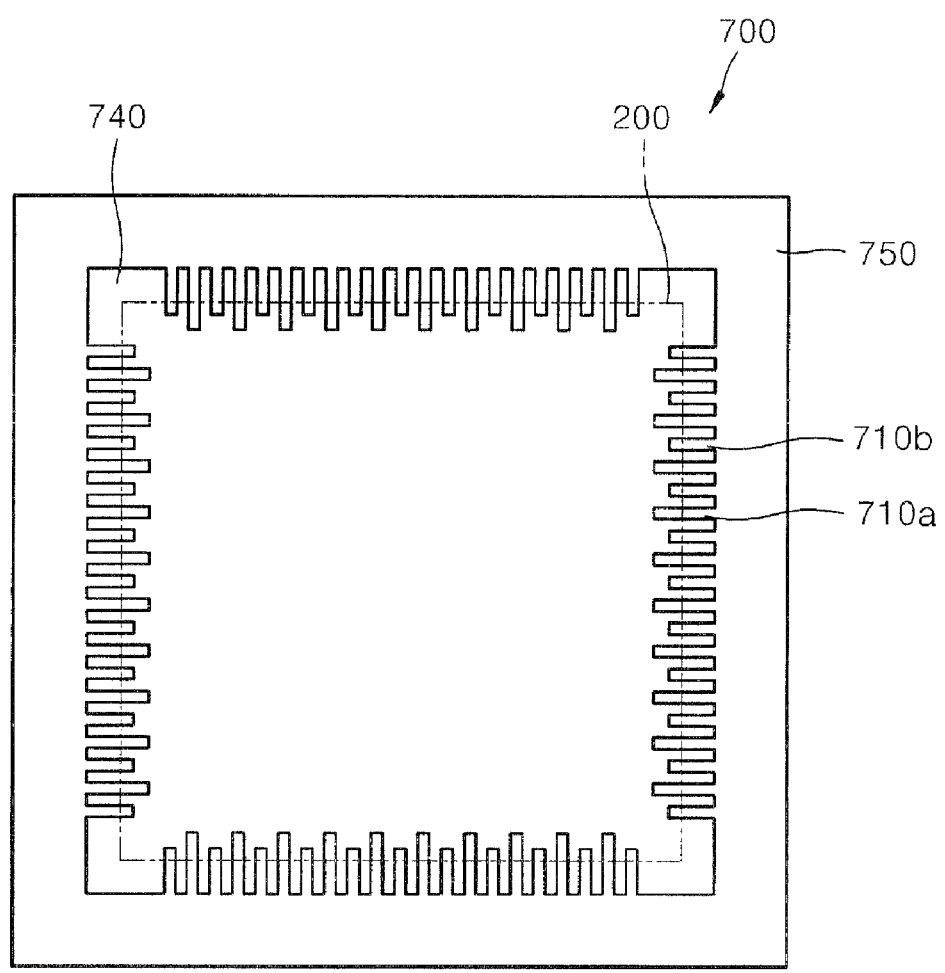
FIG. 14 illustrates a lead frame for forming lead lines in a second semiconductor package according to another embodiment of the present invention.
Figure 15:
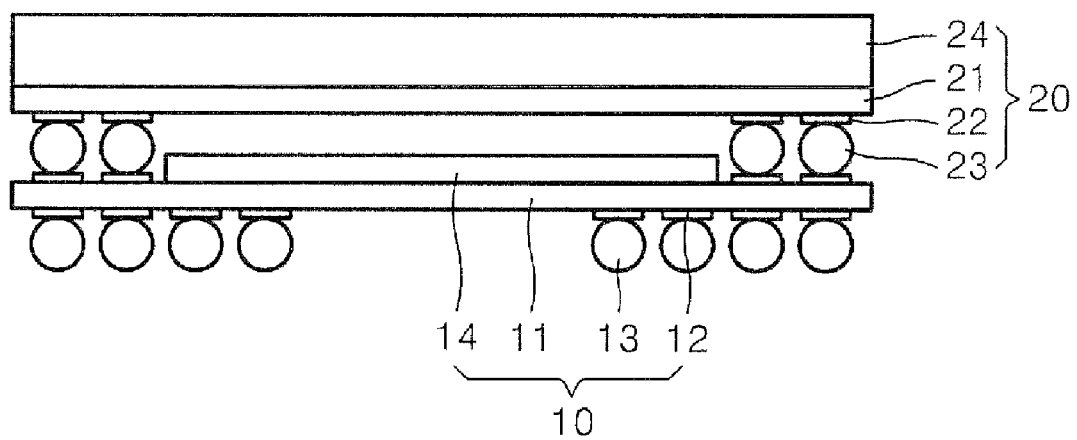
FIG. 15 illustrates a conventional POP package.
Figure 16A:
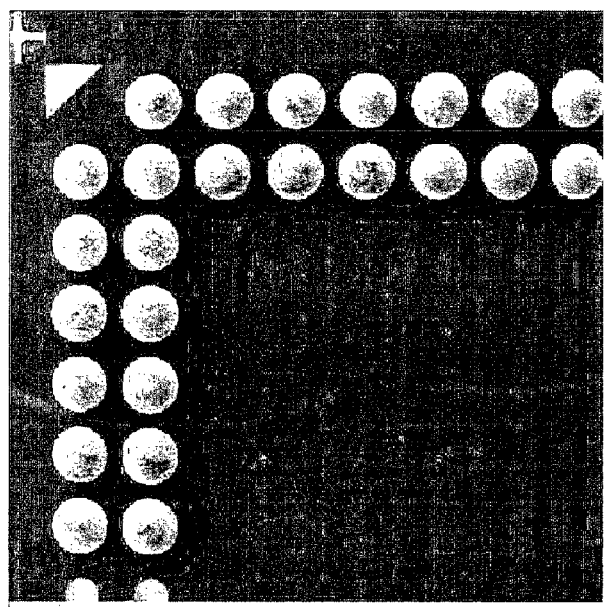
FIGS. 16A and 16B are enlarged photographs illustrating the layout of normal solder balls and the layout of short-circuited solder balls, respectively.
Figure 16B:
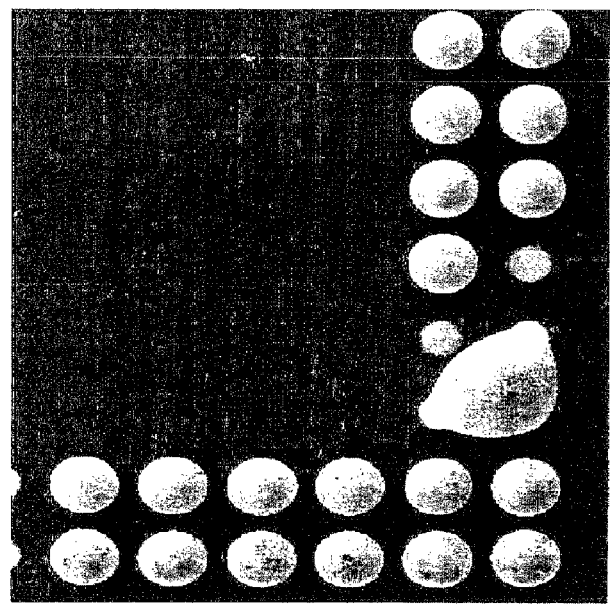
Figure 17A:
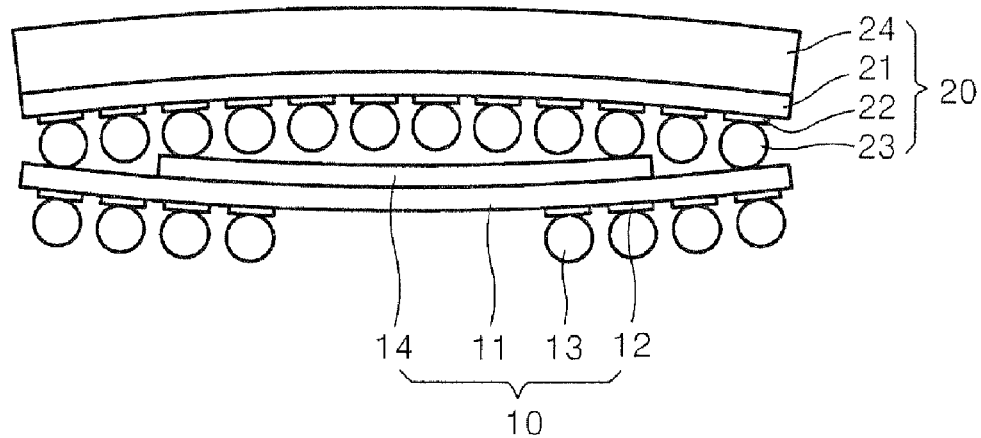
FIGS. 17A and 17B illustrate a conventional POP package short-circuited due to warpage.
Figure 17B:
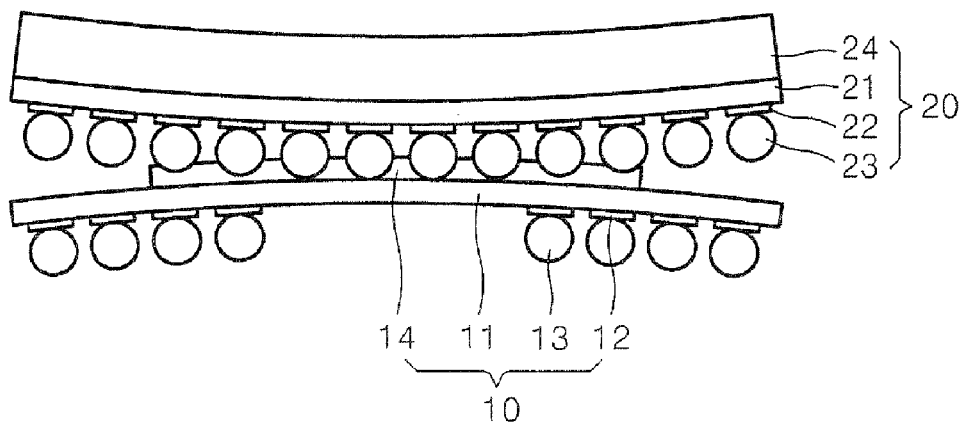

After the second semiconductor package 200 is prepared as described above, lead lines may be formed using a lead frame 700 as shown in FIG. 14. Referring to FIG. 14, the lead frame 700 includes a lead frame support 750 and a punched portion 740 formed therein, first lead lines 710*b* formed along an inner perimeter of the punched portion 740 of the lead frame 700 and corresponding to the outer external contact electrodes 220*b* of the second semiconductor package 200, and second lead lines 710*a* corresponding to the inner external contact electrodes 220*a* and having a length greater than that of the first lead lines 710*b*. Particularly, the first lead lines 710*b* and the second lead lines 710*a* are alternately repeated and formed along the inner perimeter of the punched portion 740.

The second semiconductor package 200 is connected to the lead frame 700 and the lead lines 710*a* and 710*b* are separated from the lead frame support 750, such that the lead lines 710*a* and 710*b* are formed in the second semiconductor package 200. The lead lines 710*a* and 710*b* are then bent toward the first semiconductor package 100 so that the second semiconductor package 200 is connected to the first semiconductor package 100.

Once connected as described above, the first semiconductor package 100 and the second semiconductor package 200 form one POP package, which may be mounted on the external board. To mount the POP package on the external board, the external contact electrodes formed in the first semiconductor package 100 may be connected with the contact electrodes formed on the external board through, for example, solder balls. The first semiconductor package 100 of the POP package may be connected with the external board by the lead lines 300 connecting the second semiconductor package 200 to the first semiconductor package 100 extending to the external board by passing through the first semiconductor package 100 (See FIG. 5).

In other words, the external contact electrodes 120 of the first substrate 110 are in the form of holes passing through the first substrate 110, and the lead lines 300 pass through the external contact electrodes 120 of the first substrate 110 when the external contact electrodes 120 of the first substrate 110 and the external contact electrodes 220 of the second substrate 210 are electrically connected with each other using the lead lines 300, such that the POP package is connected with the external board.

In this case, the end of each lead line passing through the external contact electrode of the first substrate may be in a gull-wing form, a J form, or a standing form. (See FIGS. 5, 6A and 6B).

Further, the first semiconductor package 100 may be directly connected with the external board through the solder balls 124.

According to the POP package and the fabricating method thereof of the present invention, the POP package is prevented from being short-circuited even when an underlying semiconductor package is thick and can sufficiently withstand deformation caused by post-fabrication warpage.

According to an aspect of the present invention, there is provided a package-on-package (POP) package including a first semiconductor package including a first substrate having external contact electrodes and a first semiconductor chip mounted on the first substrate; a second semiconductor package including a second substrate having external contact electrodes and a second semiconductor chip mounted on the second substrate, the second semiconductor package being located on the first semiconductor package; and lead lines for electrically connecting the external contact electrodes of the first substrate to the external contact electrodes of the second substrate.

The connection between the first semiconductor package and the second semiconductor package through the lead lines eliminates the possibility that contact electrodes are short-circuited even when the first semiconductor package is thick and the semiconductor packages get smaller. Furthermore, since the lead lines are stronger than solder balls in a bonding force and can well withstand the deformation of the semiconductor package, defects caused by the warpage of the semiconductor package can be reduced.

Particularly, the lead lines may be connected to the external contact electrodes of the second substrate in parallel with the lower surface of the second substrate, extend outside the second substrate, be bent toward the first semiconductor package, and then be connected with the external contact electrode of the first substrate.

Further, the external contact electrodes of the first substrate may be in the form of holes passing through the first substrate, and the lead lines may pass through the external contact electrodes of the first substrate so that the lead lines can be connected with an external board on which the POP package is mounted. In this case, an end of each lead line may be in a gull-wing form, a J form, or a standing form.

Further, each lead line may be a bar or a pin.

The external contact electrodes of the second substrate may be formed in two lines along an outer perimeter of the second substrate on the lower surface thereof, and outer external contact electrodes and inner external contact electrodes in the two lines may be formed in a zigzag pattern.

The external contact electrodes of the second substrate may be formed in two lines along an outer perimeter of the second substrate on the lower surface thereof, the lead lines connected with the outer external contact electrodes in parallel with the lower surface of the second substrate may extend outside the second substrate, are bent toward the first semiconductor package, and be connected with the external contact electrodes of the first substrate, and the lead lines connected with inner external contact electrodes in parallel with the lower surface of the second substrate may be bent toward the first semiconductor package and then connected with the external contact electrodes of the first substrate.

The external contact electrodes of the first semiconductor package may include at least one solder ball for connection to a board on which the POP package is mounted.

Further, at least one of the first semiconductor package and the second semiconductor package may be a multi-chip package (MCP).

According to another aspect of the present invention, there is provided a method of fabricating a package-on-package (POP) package, the method including preparing a first semiconductor package including a first substrate having external contact electrodes and a first semiconductor chip mounted on the first substrate; preparing a second semiconductor package including a second substrate having external contact electrodes and a second semiconductor chip mounted on the second substrate; forming lead lines in the second semiconductor package, the lead lines being electrically connected to the external contact electrodes of the second substrate; and placing the second semiconductor package on the first semiconductor package and electrically connecting the external contact electrodes of the first substrate to the external contact electrodes of the second substrate using the lead lines.

The forming of lead lines in the second semiconductor package may include bonding the second semiconductor package to a lead frame, the lead frame including a plurality of lead lines corresponding to the external contact electrodes of the second semiconductor package; separating the lead lines from the lead frame; and bending the lead lines toward the first semiconductor package when the first semiconductor package and the second semiconductor package are stacked to each other.

In this case, the preparing of a second semiconductor package may include forming the external contact electrodes of the second substrate in two lines along the outer perimeter of the second substrate on the lower surface thereof. When the outer external contact electrodes are defined as first external contact electrodes and the inner external contact electrode are defined as second external contact electrodes, the lead frame may include a lead frame support and a punched portion formed therein; a pad located at a center of the punched portion; a bridge for connecting the pad to the lead frame support and supporting the pad; first lead lines formed along an inner perimeter of the punched portion and corresponding to the first external contact electrodes; and second lead lines formed along an outer perimeter of the pad and corresponding to the second external contact electrodes. Furthermore, the separating of the lead lines from the lead frame may include cutting an end portion of the first lead line directed outside the second semiconductor package; and cutting an end portion of the second lead line directed inside the second semiconductor package.

The preparing of a second semiconductor package may include forming the external contact electrodes of the second substrate in two lines along the outer perimeter of the second substrate on the lower surface thereof, with outer external contact electrodes and inner external contact electrodes in the two lines zigzagged. In this case, the lead frame may include a lead frame support and a punched portion formed therein; first lead lines and corresponding to the outer external contact electrodes; and second lead lines corresponding to the inner external contact electrodes and having a length greater than that of the first lead lines, wherein the first lead lines and the second lead lines are alternately repeated and formed along an inner perimeter of the punched portion.

The bonding of the second semiconductor package to a lead frame may be performed using a conductive resin, conductive tape, or solder.

The external contact electrodes of the first substrate may be in the form of holes passing through the first substrate, and electrically connecting the external contact electrodes of the first substrate to the external contact electrodes of the second substrate using the lead lines may include passing the lead lines through the external contact electrodes of the first substrate and connecting the lead lines to an external board on which the POP package is mounted. In this case, the end of each lead line passing through the external contact electrode of the first substrate may be in a gull-wing form, a J form, or a standing form.

The method may further include forming solder balls in the external contact electrodes of the first semiconductor package to connect the POP package with an external board.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A package-on-package (POP) package comprising:
  a first semiconductor package including a first substrate having external contact electrodes and a first semiconductor chip mounted on the first substrate;
  a second semiconductor package including a second substrate having external contact electrodes and a second semiconductor chip mounted on a first surface of the second substrate, the second semiconductor package overlying the first semiconductor package; and
  lead lines for electrically connecting the external contact electrodes of the first substrate to the external contact electrodes of the second substrate,
  wherein the external contact electrodes of the second substrate are disposed on a second surface of the second substrate opposite the first surface and protrude from second surface of the second substrate.

2. The package of claim 1, wherein the lead lines are connected to the external contact electrodes of the second substrate in parallel with a lower surface of the second substrate, extend outside the second substrate, are bent toward the first semiconductor package, and are connected with the external contact electrodes of the first substrate.

3. The package of claim 2, wherein a bent portion of the lead lines makes an angle of about 90 degree to about 120 degree with respect to the lower surface of the second substrate.

4. The package of claim 1, wherein the external contact electrodes of the first substrate are in the form of holes passing through the first substrate, and the lead lines pass through the external contact electrodes of the first substrate and are connected with an external board on which the POP package is mounted.

5. The package of claim 4, wherein an end of each lead line is in a gull-wing form, a J form, or a standing form.

6. The package of claim 1, wherein each lead line is a bar or a pin.

7. The package of claim 1, wherein the external contact electrodes of the second substrate are disposed in two lines along an outer perimeter of the second substrate on a lower surface thereof, and the external contact electrodes comprise outer external contact electrodes and inner external contact electrodes disposed in a zigzag pattern.

8. The package of claim 1, wherein the external contact electrodes of the second substrate are disposed in two lines along an outer perimeter of the second substrate on a lower surface thereof, the external contact electrodes comprise outer external contact electrodes and inner external contact electrodes, the lead lines connected to the outer external contact electrodes are disposed in parallel with the lower surface of the second substrate, extend outside the second substrate, are bent toward the first semiconductor package, and are connected with the external contact electrodes of the first substrate, and the lead lines connected to the inner external contact electrodes are disposed in parallel with the lower surface of the second substrate, are bent toward the first semiconductor package, and are connected with the external contact electrodes of the first substrate.

9. The package of claim 1, wherein the external contact electrodes of the first semiconductor package comprise at least one solder ball for connection to a board on which the POP package is mounted.

10. The package of claim 1, wherein at least one of the first semiconductor package and the second semiconductor package is a multi-chip package (MCP).

* * * * *